(12) United States Patent
Liaw

(10) Patent No.: US 7,738,282 B2
(45) Date of Patent: Jun. 15, 2010

(54) CELL STRUCTURE OF DUAL PORT SRAM

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 438 days.

(21) Appl. No.: 11/787,677

(22) Filed: Apr. 17, 2007

(65) Prior Publication Data

US 2008/0197419 A1    Aug. 21, 2008

Related U.S. Application Data

(60) Provisional application No. 60/901,373, filed on Feb. 15, 2007.

(51) Int. Cl.
  *G11C 11/00* (2006.01)
(52) U.S. Cl. ............... 365/154; 365/63; 365/230.05; 257/903; 257/E21.661; 257/E27.098; 257/E27.099
(58) Field of Classification Search ............ 257/903, 257/E21.661, E27.098, E27.099; 365/154, 365/156, 230.05, 63
  See application file for complete search history.

(56) References Cited

U.S. PATENT DOCUMENTS

| | | | |
|---|---|---|---|
| 6,535,453 B2* | 3/2003 | Nii et al. ............... | 365/230.05 |
| 6,693,820 B2* | 2/2004 | Nii et al. ............... | 365/154 |
| 6,812,574 B2* | 11/2004 | Tomita et al. .......... | 257/773 |
| 6,909,135 B2* | 6/2005 | Nii et al. ............... | 257/297 |
| 6,977,837 B2* | 12/2005 | Watanabe et al. ...... | 365/156 |
| 7,236,396 B2* | 6/2007 | Houston et al. ........ | 365/185.07 |

OTHER PUBLICATIONS

Nii, K., et al., "A 90nm Dual-Port SRAM with 2.04μm²8T-Thin Cell Using Dynamically-Controlled Column Bias Scheme," ISSCC 2004/ Session 27/SRAM/27.9, 2004 IEEE International Solid-State Circuits Conference, 10 pp., IEEE.

* cited by examiner

*Primary Examiner*—Dang T Nguyen
*Assistant Examiner*—Alexander Sofocleous
(74) *Attorney, Agent, or Firm*—Slater & Matsil, L.L.P.

(57) ABSTRACT

An integrated circuit and methods for laying out the integrated circuit are provided. The integrated circuit includes a first and a second transistor. The first transistor includes a first active region comprising a first source and a first drain; and a first gate electrode over the first active region. The second transistor includes a second active region comprising a second source and a second drain; and a second gate electrode over the second active region and connected to the first gate electrode, wherein the first source and the second source are electrically connected, and the first drain and the second drain are electrically connected.

14 Claims, 8 Drawing Sheets

CELL STRUCTURE OF DUAL PORT SRAM

CROSS REFERENCES

This application claims the benefit of the following provisionally filed U.S. Patent application: Application Ser. No. 60/901,373, filed Feb. 15, 2007, entitled "Cell Structure for Dual Port SRAM," which patent application is incorporated herein by reference.

TECHNICAL FIELD

This invention relates generally to semiconductor devices, and more particularly to memory cells, and even more particularly to structures and layout designs of static random access memory cells.

BACKGROUND

Static random access memories (SRAM) are commonly used in integrated circuits. SRAM cells have the advantageous feature of holding data without requiring a refresh. Typically, an SRAM cell includes two pass-gate transistors, through which a bit can be read from or written into the SRAM cell. This type of SRAM cell is referred to as a single port SRAM cell. Another type of SRAM cell is referred to as dual port SRAM cell, and each of the SRAM cells includes four pass-gate transistors.

FIG. 1 illustrates an exemplary circuit diagram of a typical eight-transistor dual port SRAM cell, which includes pull-up transistors PU-1 and PU-2 and pull-down transistors PD-1 and PD-2. Pass-gate transistors PG-1 and PG-2 form a first port (port-A) of the dual port SRAM cell. Pass-gate transistors PG-3 and PG-4 form a second port (port-B) of the dual port SRAM cell. The gates of pass-gate transistors PG-1 and PG-2 are controlled by word-line port-A WL, while the gates of pass-gate transistors PG-3 and PG-4 are controlled by word-line port-B WL. A latch formed of pull-up transistors PU-1 and PU-2 and pull-down transistors PD-1 and PD-2 stores a bit. The stored bit can be read through port-A using bit-lines port-A BL and port-A BLB, or through port-B using bit-lines port-B BL and port-B BLB. Conversely, a bit can be written into the SRAM cell through either port-A or port-B.

Advantageously, with two ports, the bit stored in the SRAM cell can be read from port-A and port-B simultaneously. This allows for parallel operations by different applications. Additionally, if a first SRAM cell and a second SRAM cell are in a same column or a same row, a read operation to the first SRAM cell can also be performed simultaneously with a write operation on the second SRAM cell.

Conventionally, to support parallel operations, in which two ports may be at the "on" state at the same time, the pull-down transistors PD-1 and PD-2 each need to sustain twice the drive current of each of the pass-gate transistors PG-1 through PG-4. Accordingly, in conventional designs, pull-down transistors PD-1 and PD-2 were designed twice as wide as pass-gate transistors PG-1 through PG-4. FIG. 2 illustrates a conventional layout of transistors PG-1 and PD-2. The dotted region is an active region, and shaded regions are gate polys. The active region is L-shaped, with a wide portion for forming pull-down transistor PD-2 being twice as wide or even greater than a narrow portion for forming pass-gate transistor PG-1. Due to optical effects, the intersection region between the wide portion and the narrow portion is rounded. If a misalignment occurs, and the gate poly of pass-gate transistor PG-1 is moved up, the actual gate width of pass-gate transistor PG-1 will be greater than desired. Accordingly, a mismatching occurs between pass-gate transistor PG-1 and pass-gate transistors PG-2 through PG-4, which in turn affects the SRAM cell performance.

An additional problem is the current crowding at the intersection region. In the intersection region, the currents are not evenly distributed. Therefore, some portions of the pull-down devices PD-1 and PD-2 may have greater current densities then other portions.

Accordingly, what is needed in the art is an SRAM cell that may incorporate dual ports thereof to take advantage of the benefits associated with the parallel operations while at the same time overcoming the deficiencies of the prior art.

SUMMARY OF THE INVENTION

In accordance with one aspect of the present invention, an integrated circuit includes a first and a second transistor. The first transistor includes a first active region comprising a first source and a first drain; and a first gate electrode over the first active region. The second transistor includes a second active region comprising a second source and a second drain; and a second gate electrode over the second active region and connected to the first gate electrode, wherein the first source and the second source are electrically connected, and the first drain and the second drain are electrically connected.

In accordance with another aspect of the present invention, a dual port static random access memory (SRAM) cell includes a first pull-up transistor having a first source and a first drain; a second pull-up transistor having a second source and a second drain; and a first and a second pull-down transistor; a first pull-down transistor including a first drain end connected to the first drain of the first pull-up transistor, and a first gate end connected to a gate of the first pull-up transistor, and a second pull-down transistor including a second drain end connected to the second drain of the second pull-up transistor, and a second gate end connected to a gate of the second pull-up transistor. The first pull-down transistor includes a first sub-transistor and a second sub-transistor, wherein a drain of the first sub-transistor is connected to a drain of the second sub-transistor to form the first drain end, a source of the first sub-transistor is connected to a source of the second sub-transistor to form a first source end, and a gate of the first sub-transistor is connected to a gate of the second sub-transistor to form the first gate end. The second pull-down transistor includes a third sub-transistor and a fourth sub-transistor, wherein a drain of the third sub-transistor is connected to a drain of the fourth sub-transistor to form the second drain end, a source of the third sub-transistor is connected to a source of the fourth sub-transistor to form a second source end, and a gate of the third sub-transistor is connected to a gate of the fourth sub-transistor to form the second gate end.

In accordance with yet another aspect of the present invention, an SRAM cell includes a first active region; a second active region parallel to the first active region, wherein longitudinal directions of the first and the second active regions are in a first direction; a first gate poly extending from over the first active region to over the second active region, wherein the first gate poly has a longitudinal direction in a second direction perpendicular to the first direction; a metal line in a metallization layer and electrically connecting a first portion of the first active region and a first portion of the second active region; and a conductive feature electrically connecting a second portion of the first active region and a second portion of the second active region, wherein the second portions of the first and the second active regions are on opposite sides of the first gate poly than the first portions of the first and the second active regions, respectively.

The advantageous features of the present invention include reduced current crowding effects and reduced effects in the matching of pass-gate transistors due to misalignment.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel static random access memory (SRAM) cell structure and the corresponding layouts are provided. The variations of the preferred embodiments are then discussed. Throughout the various views and illustrative embodiments of the present invention, like reference numbers are used to designate like elements.

Figure 1:
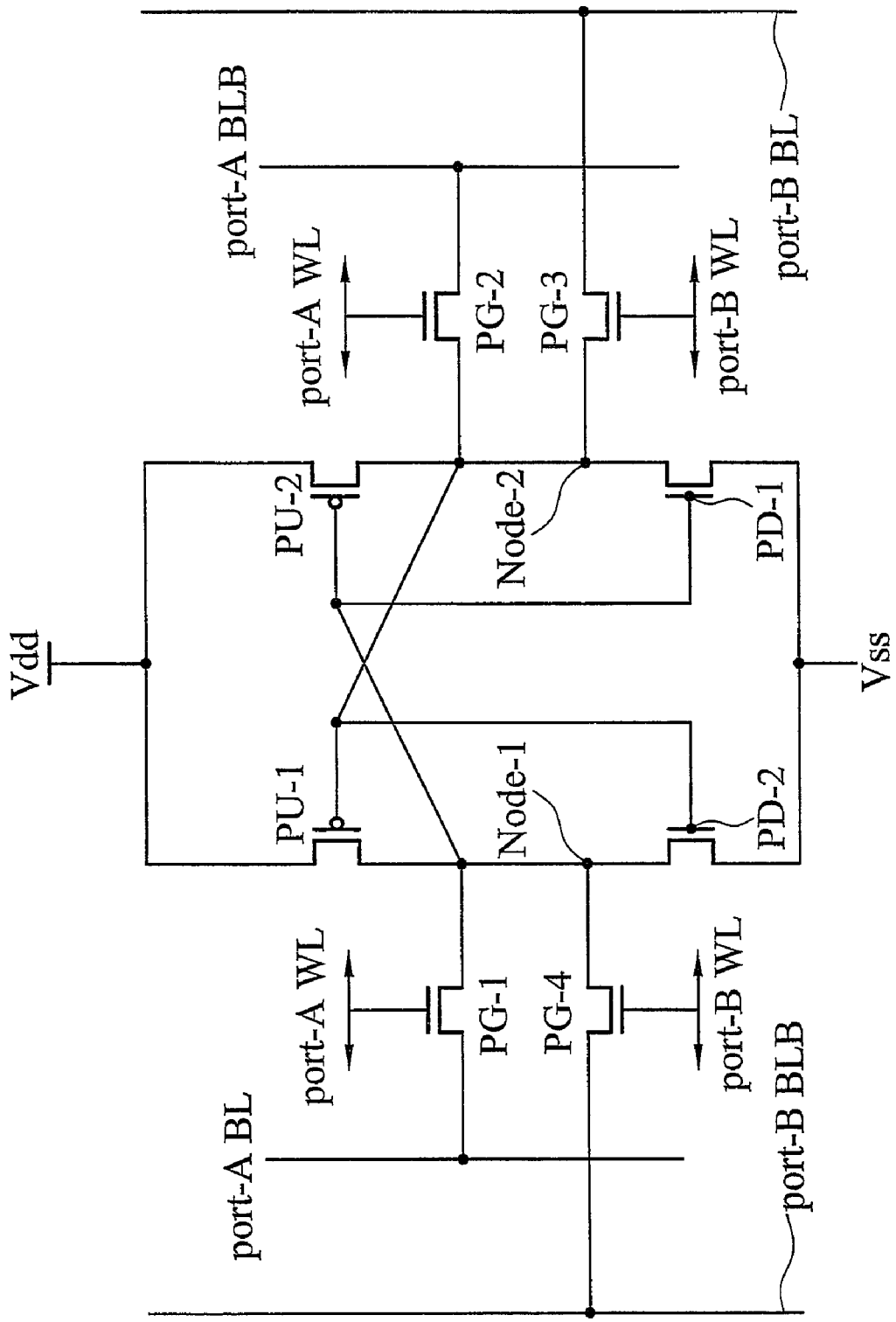
FIG. 1 illustrates a circuit diagram of a conventional dual port static random access memory (SRAM) cell.
Figure 2:
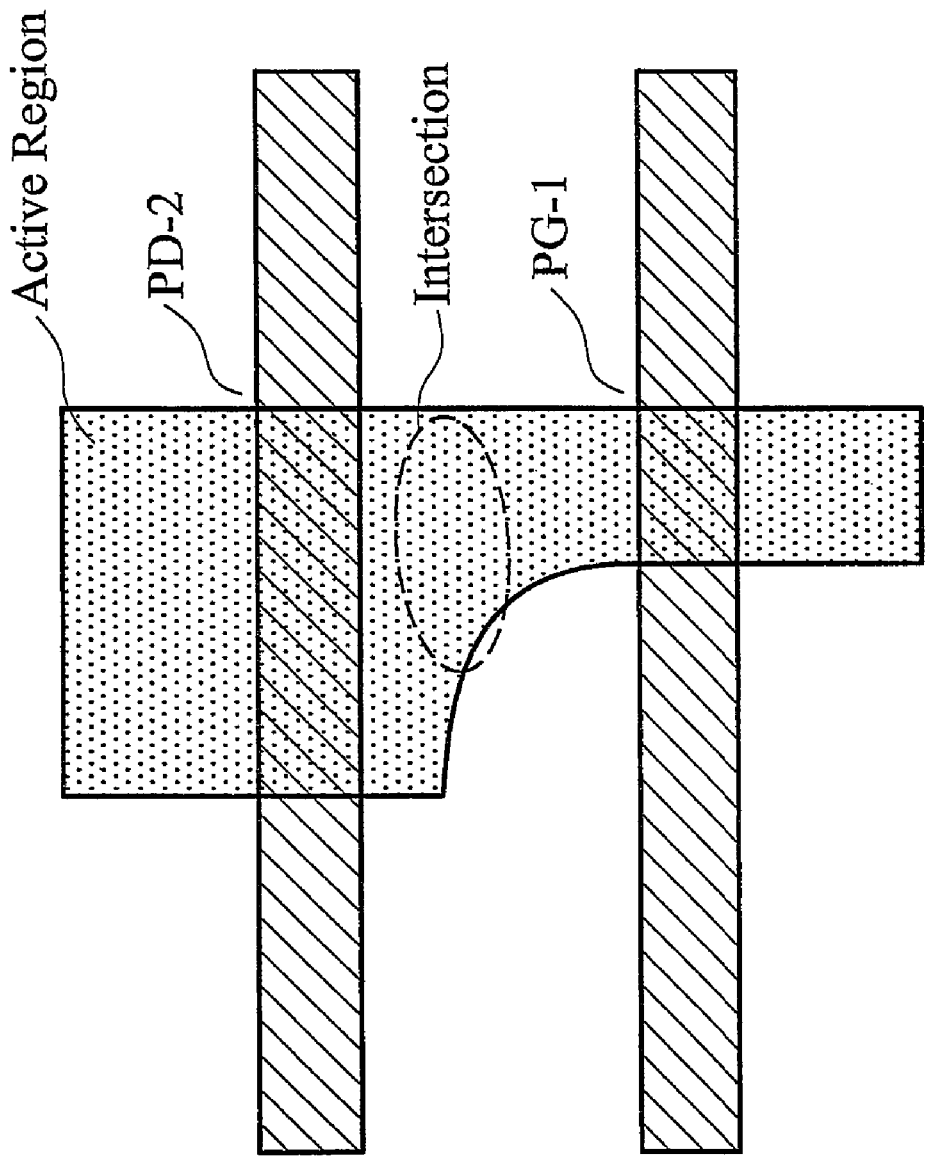
FIG. 2 illustrates a portion of the layout showing transistors PG-1 and PD-2 in FIG. 1.
Figure 3:
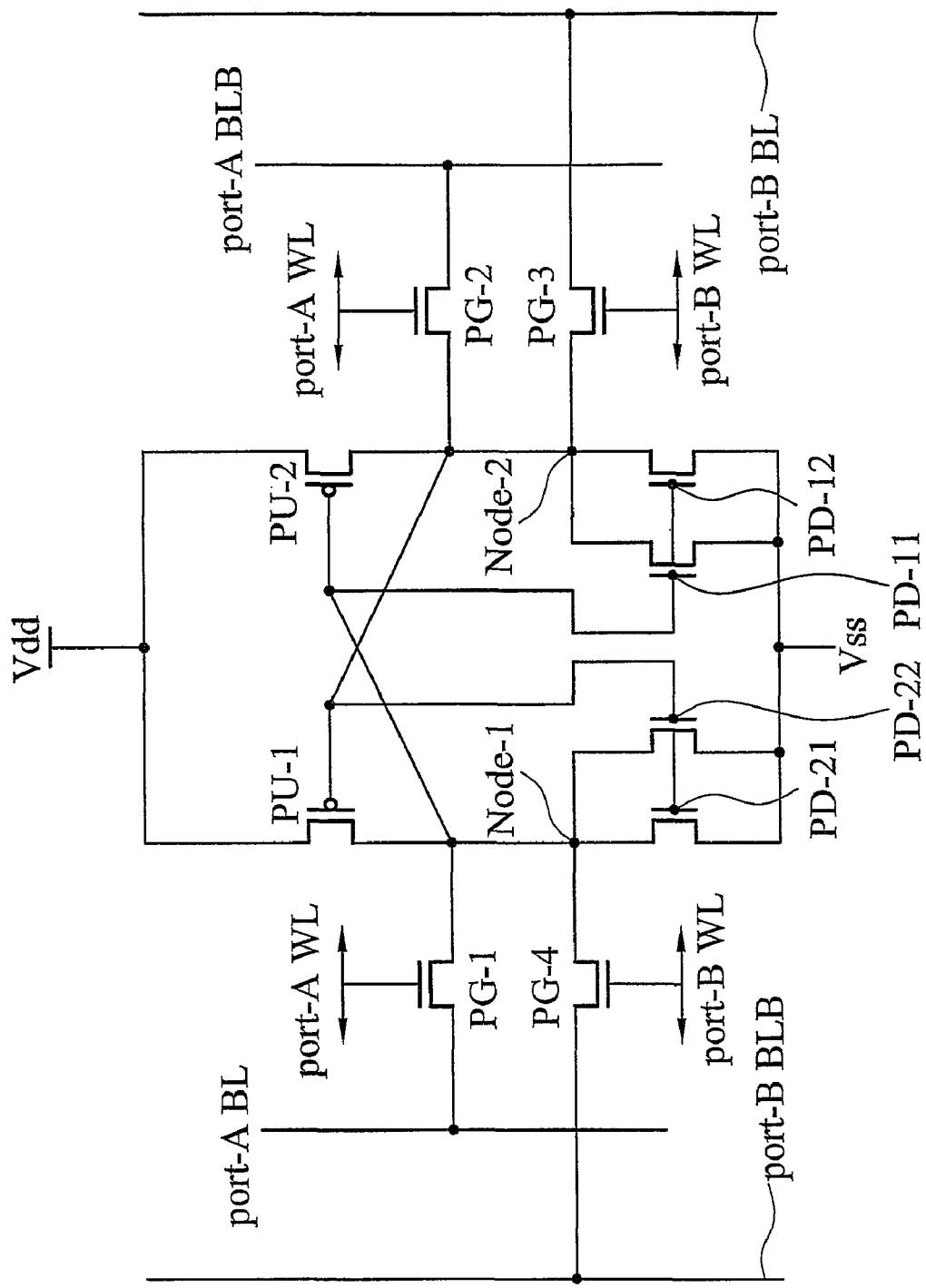
FIG. 3 illustrates a circuit diagram of a dual port SRAM cell embodiment.

FIG. 3 illustrates a circuit diagram of dual port SRAM cell, which includes pull-up transistors PU-1 and PU-2 and pull-down transistors PD-11, PD-12, PD-21 and PD-22. Pass-gate transistors PG-1 and PG-2 form a first port (port-A) of the dual port SRAM cell. Pass-gate transistors PG-3 and PG-4 form a second port (port-B) of the dual port SRAM cell. The gates of pass-gate transistors PG-1 and PG-2 are controlled by a word-line denoted as port-A WL, while the gates of pass-gate transistors PG-3 and PG-4 are controlled by a word-line denoted as port-B WL.

Pull-down transistors PD-11 and PD-12 have their sources interconnected, their drains interconnected, and their gates interconnected. Pull-down transistors PD-21 and PD-22 have their sources interconnected, their drains interconnected, and their gates interconnected. Accordingly, pull-down transistors PD-11 and PD-12 act as a single pull-down transistor, and pull-down transistors PD-21 and PD-22 act as a single pull-down transistor.

Figure 4:
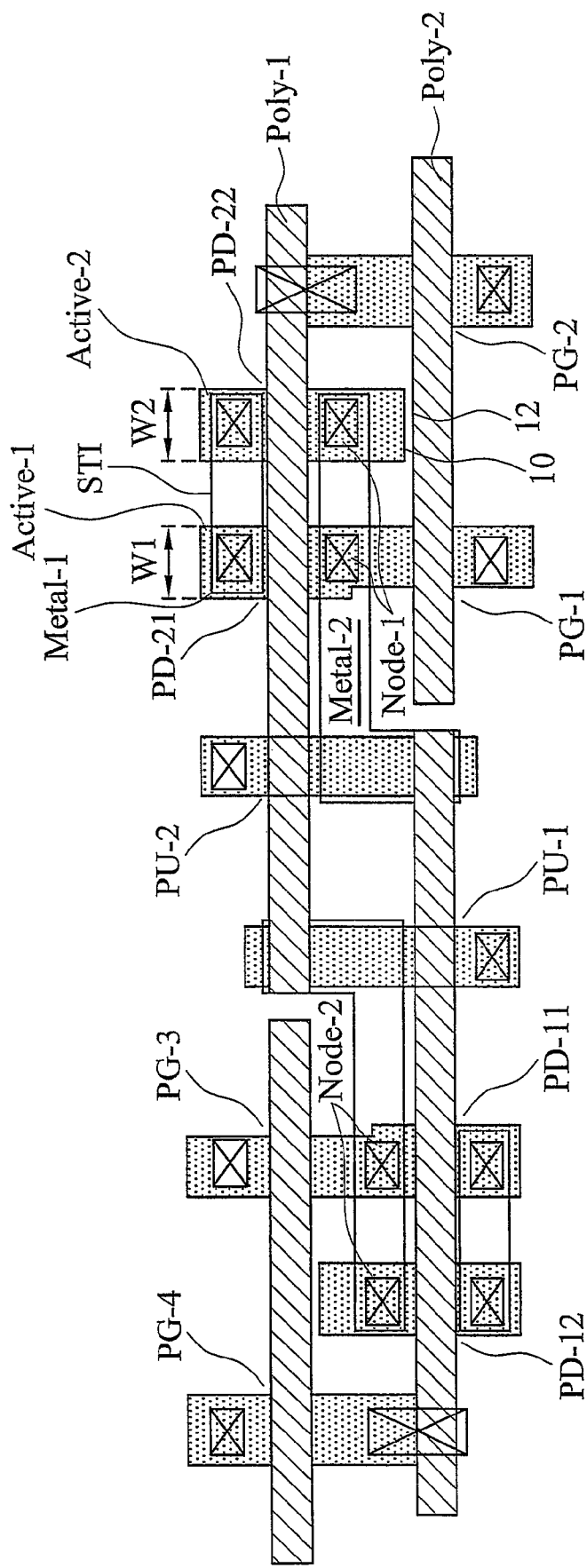
FIG. 4 illustrates an exemplary layout of the SRAM cell shown in FIG. 3.

FIG. 4 illustrates an exemplary layout of the SRAM cell shown in FIG. 3, wherein like devices and nodes in FIG. 3 are shown with like reference notations. Please note that in the following discussion, pull-down transistors PD-21 and PD-22 and their connecting pass-gate transistors are used as examples. However, the same concepts also apply to pull-down transistors PD-11 and PD-12 and other pass-gate transistors. Pull-down transistors PD-21 and PD-22 are formed over active regions Active-1 and Active-2, respectively, and are separated from each other by a shallow trench isolation (STI) region. Accordingly, the channel regions of transistors PD-21 and PD-22 are separated from each other. A common gate poly Poly-1 is shared by transistors PD-21 and PD-22. Throughout the description, the term "gate poly" is used to refer to the conductive lines used for forming gates of transistors, even if the conductive lines may be formed of other conductive materials such as metals, metal suicides, metal nitrides, polysilicon, and combinations thereof. The sources of transistors PD-21 and PD-22 are physically separated, but are electrically connected through metal line Metal-1 in a metallization layer, for example, the lowest metallization layer (M1). Similarly, the drains (marked as Node-1) of transistors PD-21 and PD-22 are physically separated, but are electrically connected by metal line Metal-2 and connecting contacts. In the preferred embodiment, width W1 of active region Active-1 is preferably substantially close to width W2 of active region Active-2. Accordingly, the drive currents of transistors PD-21 and PD-22 are substantially matched. Also, the channel widths of transistors PD-21 and PD-22 may be substantially close to the channel width of pass-gate transistors PG-1 and PG-2. Alternatively, widths W1 and W2 are substantially different, with a sum of width W1 and W2 being substantially equal to, or even greater than, twice the channel widths of pass-gate transistors PG-1 and PG-2. An additional gate poly Poly-2 extends over active region Active-1 to form pass-gate transistor PG-1. Further gate poly Poly-2 forms pass-gate transistor PG-2 with an underlying active region. Gate poly Poly-2 is connected to word-line port-A WL.

In an exemplary layout, bit-lines port-A BL, port-A BLB, port-B BL and port-B BLB (not shown in FIG. 4, please refer to FIG. 3) are in M1. Word-lines port-A WL and port-B WL are in the second metallization layer (M2). Accordingly, metal lines Metal-1 and Metal-2 may be deployed in M1 without interfering the existing line distribution.

Figure 5:
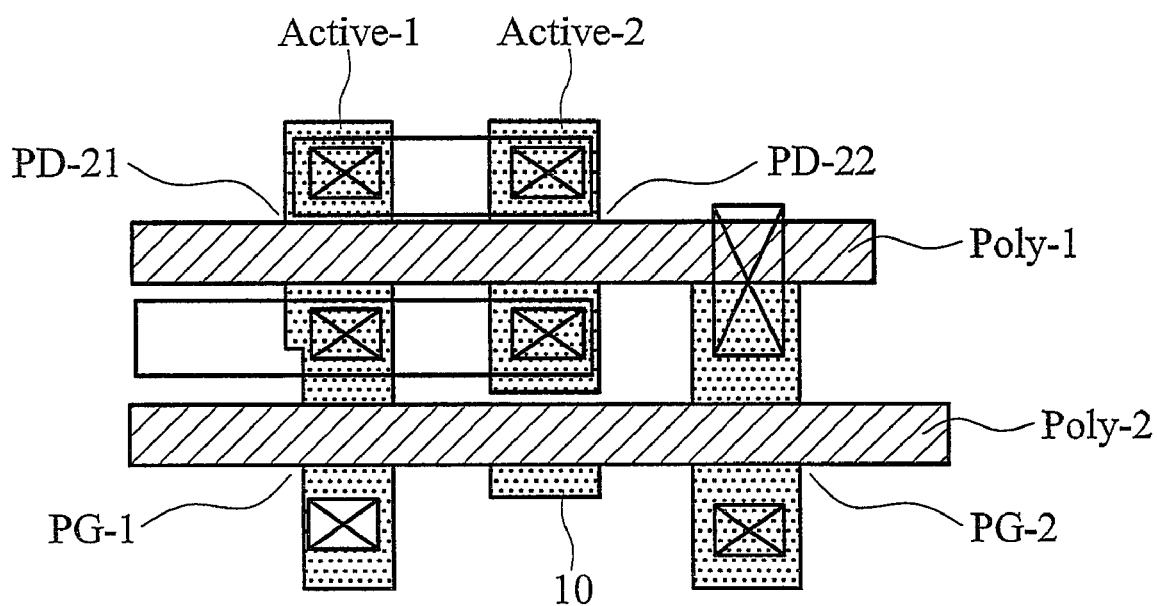
FIG. 5 illustrates the formation of a dummy transistor.

FIG. 4 only illustrates one of the possible layouts. One skilled in the art will realize that there are multiple variations. For example, edge 10 of active region Active-2 is either spaced apart from, or substantially aligned to, edge 12 of gate poly Poly-2. Accordingly, due to the existence of active region Active-2, the chip region above gate poly Poly-2 is relatively dense, while the chip region below gate poly Poly-2 is relatively sparse. This may affect the profile of STI regions and active regions. As a result, the electrical characteristics of pass-gate devices PG-1 and PG-2 may be adversely affected. FIG. 5 illustrates a layout for solving the above-discussed problem. For simplicity, in FIG. 5 and other subsequently discussed Figures, only the portion of the SRAM cell including pull-down transistors PD-21 and PD-22 and the connecting pass-gate transistors is illustrated. In FIG. 5, active region Active-2 extends beyond gate poly Poly-2, forming a dummy transistor with gate poly Poly-2. Edge 10, accordingly, is beyond gate poly Poly-2. With this design, the density of the active regions is more uniform, thus device performance of pass-gate devices PG-1 and PG-2 is more stable.

Figure 6:
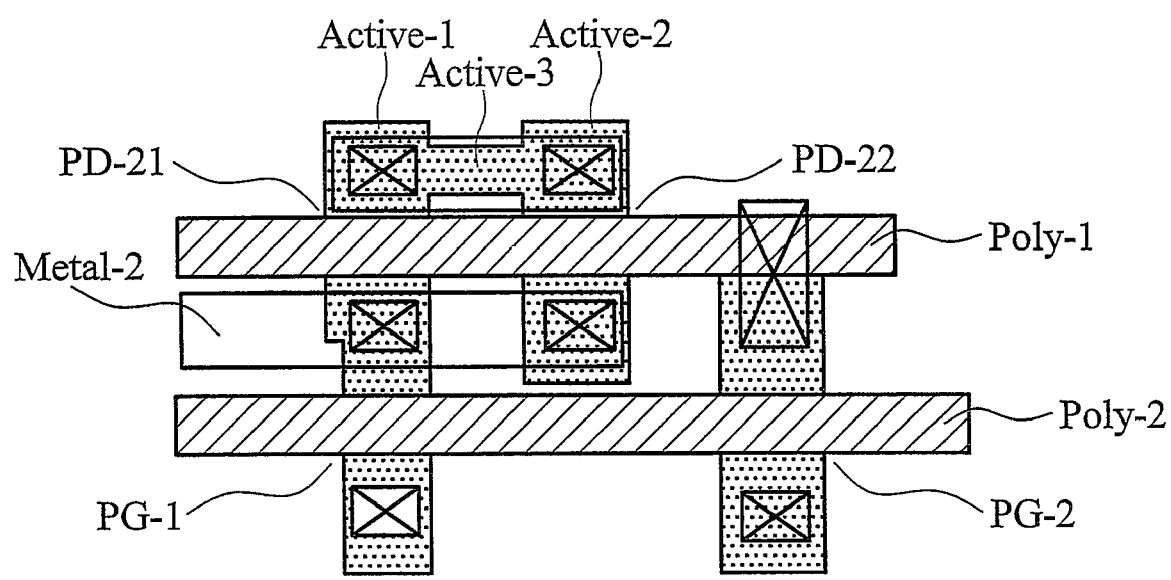
FIG. 6 illustrates the connection of pull-down transistors PD-21 and PD-22 using an adjoining active region.

FIG. 6 illustrates a further layout, wherein the sources of pull-down transistors PD-21 and PD-22 are connected by a connecting active region Active-3. The drains of pull-down transistors PD-21 and PD-22, however, are preferably connected through contacts and metal line Metal-2.

Referring back to FIGS. 4 through 6, it is found that when a current flows from pass-gate transistor PG-1 into pull-down transistors PD-21 and PD-22, the current is distributed to the drains of pull-down transistors PD-21 and PD-22. Since contacts and metal lines in the metallization layers have low resistances, the current may be substantially evenly distributed to transistors PD-21 and PD-22. Current crowding effect is thus reduced. In addition, since active region Active-1 has a substantially uniform width (as compared to conventional L-shaped active regions), even if a misalignment occurs where gate poly Poly-2 is formed, the channel width of pass-gate transistor PG-1 remains the same. This reduces the likelihood of mismatching between pass-gate transistor PG-1 and pass-gate transistors PG-2 through PG-4.

Figure 7:
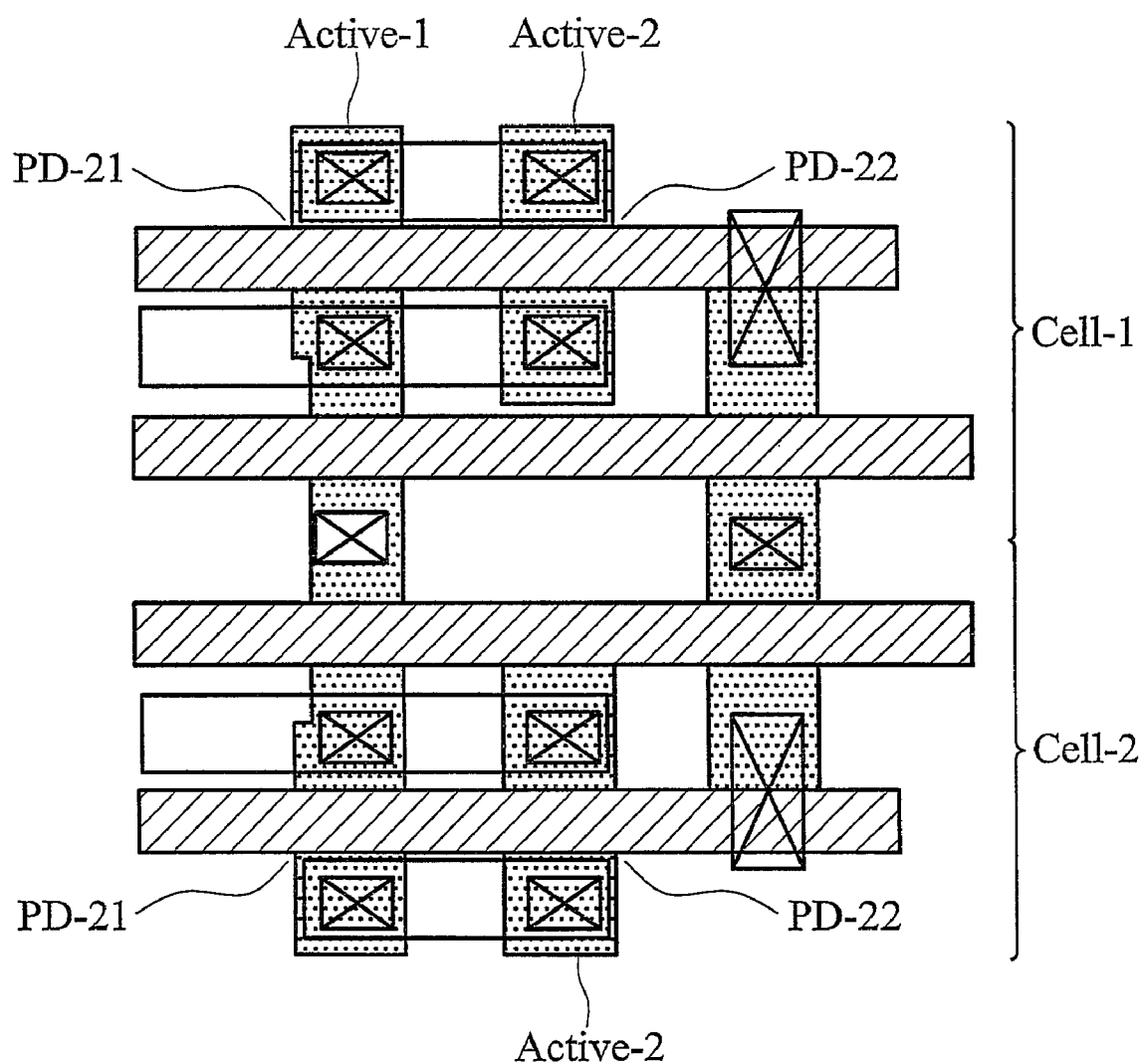
FIGS. 7 and 8 illustrate the layouts of a plurality of SRAM cells.

FIG. 7 illustrates the layout of pull-down transistors of two neighboring SRAM cells Cell-1 and Cell-2. Preferably, active regions Active-1 of the neighboring SRAM cells Cell-1 and Cell-2 are merged together as a long active region extending through both SRAM cells, while active regions Active-2 of the neighboring SRAM cells Cell-1 and Cell-2 are separated from each other.

Figure 8:
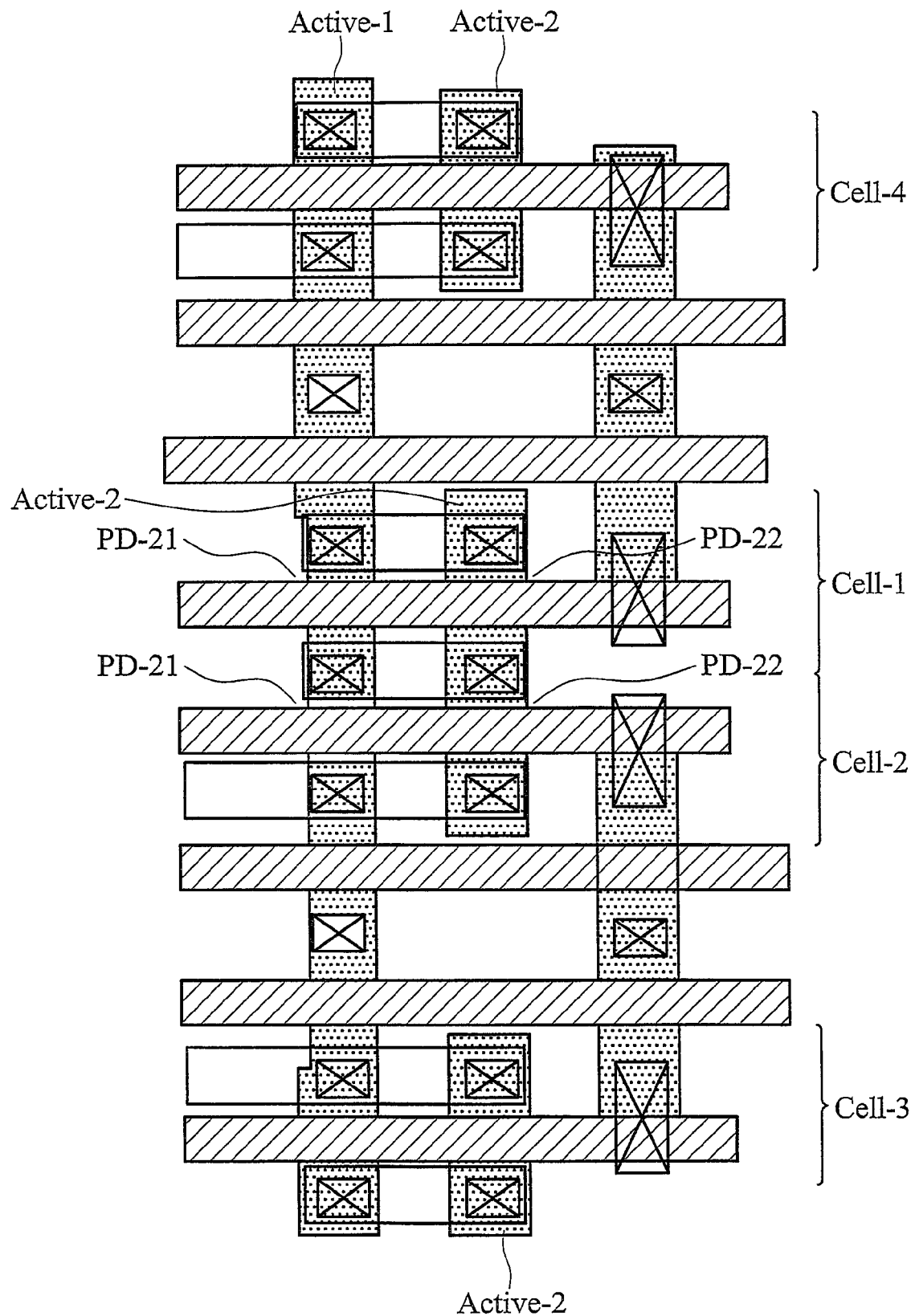

FIG. 8 illustrates a further embodiment, wherein more SRAM cells are illustrated. In this embodiment, the source of pull-down transistor PD-22 in SRAM cell Cell-1 is shared by the source of pull-down transistor PD-22 in neighboring cell Cell-2. Accordingly, active regions Active-2 of the neighboring cells Cell-1 and Cell-2 are adjoined. However, the drain of pull-down transistor PD-22 in SRAM cell Cell-1 is disconnected from the drains of pull-down transistor PD22 in cells Cell-2 and Cell-4. Active regions Active-1 of the neighboring SRAM cells Cell-1 through Cell-4 adjoin to each other, and may further extend to upper and lower directions to adjoin more active regions Active-1 of other SRAM cells.

In the embodiment discussed in the preceding paragraphs, two pull-down transistors are interconnected to function as a single pull-down transistor. If needed, three or more pull-down transistors can be connected to function as a single pull-down transistor, resulting in more evenly distributed currents, particularly for MOS devices with high drive currents. One skilled in the art will realize the respective layouts.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A dual port static random access memory (SRAM) cell comprising:
   a first pull-up transistor having a first source and a first drain;
   a second pull-up transistor having a second source and a second drain;
   a first pull-down transistor comprising:
      a first drain end connected to the first drain of the first pull-up transistor; and
      a first gate end connected to a gate of the first pull-up transistor;
   a second pull-down transistor comprising:
      a second drain end connected to the second drain of the second pull-up transistor; and
      a second gate end connected to a gate of the second pull-up transistor;
   wherein the first pull-down transistor comprises:
      a first sub-transistor; and
      a second sub-transistor, wherein a drain of the first sub-transistor is connected to a drain of the second sub-transistor to form the first drain end, a source of the first sub-transistor is electrically connected to a source of the second sub-transistor by an additional active region to form a first source end, and a gate of the first sub-transistor is connected to a gate of the second sub-transistor to form the first gate end; and
   wherein the second pull-down transistor comprises:
      a third sub-transistor; and
      a fourth sub-transistor, wherein a drain of the third sub-transistor is connected to a drain of the fourth sub-transistor to form the second drain end, a source of the third sub-transistor is connected to a source of the fourth sub-transistor to form a second source end, and a gate of the third sub-transistor is connected to a gate of the fourth sub-transistor to form the second gate end.

2. The dual port SRAM cell of claim 1, wherein the drains of the first and the second sub-transistors are physically disconnected by an insulating region, and are electrically connected through a metal line and connecting contacts.

3. The dual port SRAM cell of claim 2, wherein the sources of the first and the second sub-transistors are physically disconnected by an insulating region, and are electrically connected through a metal line and connecting contacts.

4. The dual port SRAM cell of claim 1, wherein a channel region of the first sub-transistor is separated from a channel region of the second sub-transistor by a first insulating region, and a channel region of the third sub-transistor is separated from a channel region of the fourth sub-transistor by a second insulating region.

5. The dual port SRAM cell of claim 1 further comprising:
   a first and a second pass-gate transistor each having a source/drain connected to the first drain end of the first pull-down transistor; and
   a third and a fourth pass-gate transistor each having a source/drain connected to the second drain end of the second pull-down transistor, wherein each of the first, the second, the third and the fourth pass-gate transistors further comprises an additional source/drain region connected to a bit-line.

6. The dual port SRAM cell of claim 5, wherein the first sub-transistor and the first pass-gate transistor share a first active region, the second sub-transistor comprises a second active region, and wherein the first and the second active regions are physically separated by an insulating region.

7. The dual port SRAM cell of claim 6, wherein the second active region extends beyond a gate electrode line of the first pass-gate transistor, and wherein the second active region forms a dummy transistor with the gate electrode line.

8. A semiconductor structure comprising:
   a first static random access memory (SRAM) cell comprising:
      a first active region;
      a second active region parallel to the first active region, wherein longitudinal directions of the first and the second active regions are in a first direction;
      a first gate poly extending from over the first active region to over the second active region, wherein the first gate poly has a longitudinal direction in a second direction perpendicular to the first direction;

a metal line in a metallization layer and electrically connecting a first portion of the first active region and a first portion of the second active region; and a conductive feature electrically connecting a second portion of the first active region and a second portion of the second active region, wherein the second portions of the first and the second active regions are on opposite sides of the first gate poly than the first portions of the first and the second active regions, respectively, wherein the conductive feature comprises a third active region adjoining the second portions of the first and the second active regions, wherein the third active region is only on one side of the first gate poly.

9. The semiconductor structure of claim 8, wherein the conductive feature comprises:

an additional metal line in a metallization layer;

a first contact connecting the additional metal line and the second portion of the first active region; and a second contact connecting the additional metal line and the second portion of the second active region.

10. A semiconductor structure comprising:

a first static random access memory (SRAM) cell comprising:

a first active region;

a second active region parallel to the first active region;

a third active region parallel to the first and the second active regions, wherein longitudinal directions of the first, the second, and the third active regions are in a first direction, and wherein the first, the second, and the third active regions are separated one from another;

a first gate poly extending from over the first active region to over the second active region, wherein the first gate poly has a longitudinal direction in a second direction perpendicular to the first direction;

a second gate poly over the first and the third active regions, wherein the second gate poly is parallel to the first gate poly;

a metal line in a metallization layer and electrically connecting a first portion of the first active region and a first portion of the second active region; and a conductive feature electrically connecting a second portion of the first active region and a second portion of the second active region, wherein the second portions of the first and the second active regions are on opposite sides of the first gate poly than the first portions of the first and the second active regions, respectively; and a word-line connected to the second gate poly.

11. The semiconductor structure of claim 10, wherein the second active region is on one side of the second gate poly only.

12. The semiconductor structure of claim 10, wherein the second active region extends on two sides of the second gate poly, and wherein the second active region and the second gate poly form a dummy transistor.

13. The semiconductor structure of claim 10 further comprising:

a second SRAM cell comprising:

the first active region;

a fourth active region parallel to the first active region, wherein the fourth active region has a longitudinal direction in the first direction, and wherein the fourth active region is physically separated from the second active region;

a third gate poly extending from over the first active region to over the fourth active region, wherein the third gate poly has a longitudinal direction in the second direction;

a second metal line electrically connecting a third portion of the first active region and a first portion of the fourth active region; and a second conductive feature electrically connecting a fourth portion of the first active region and a second portion of the fourth active region, wherein the fourth portion of the first active region and the second portion of the fourth active region are on opposite sides of the third gate poly than the third portion of the first active region and the first portion of the third active region.

14. The semiconductor structure of claim 13 further comprising:

a third SRAM cell comprising:

the first active region;

a fourth gate poly extending from over the first active region to over the second active region, wherein the metal line is between the first and the fourth gate polys; and a third conductive feature connecting a third portion of the first active region and a third portion of the second active region, wherein the third portions of the first and the second active regions are on opposite sides of the fourth gate poly than the second portions of the first and the second active regions, respectively.

* * * * *